United States Patent [19]
Ansel et al.

[11] Patent Number: 5,452,243
[45] Date of Patent: Sep. 19, 1995

[54] FULLY STATIC CAM CELLS WITH LOW WRITE POWER AND METHODS OF MATCHING AND WRITING TO THE SAME

[75] Inventors: George M. Ansel, Starkville; Jeffery S. Hunt, Ackerman, both of Miss.; Christopher W. Jones, Pleasanton, Calif.; Jeffery M. Marshall; Hatem Yazbek, both of Starkville, Miss.

[73] Assignee: Cypress Semiconductor Corporation, San Jose, Calif.

[21] Appl. No.: 281,436

[22] Filed: Jul. 27, 1994

[51] Int. Cl.$^6$ ............................................. G11C 15/00
[52] U.S. Cl. .................. 365/49; 365/189.05; 365/189.07
[58] Field of Search .............. 365/49, 189.01, 189.05, 365/189.07, 156, 202

[56] References Cited

U.S. PATENT DOCUMENTS

| | | | |
|---|---|---|---|
| 4,894,799 | 1/1990 | Hanawa et al. | 365/49 |
| 5,226,005 | 7/1993 | Lee et al. | 365/49 |
| 5,339,268 | 8/1994 | Machida | 365/49 |

OTHER PUBLICATIONS

McAuley, Anthony J. and Cotton, Charles J., "A Self-Testing Reconfigurable CAM," *IEEE Journal of Solid-State Circuits*, vol. 26, No. 3, Mar. 1991, pp. 257–261.

*Primary Examiner*—Joseph A. Popek
*Assistant Examiner*—Tan Nguyen
*Attorney, Agent, or Firm*—Blakely, Sokoloff, Taylor & Zafman

[57] ABSTRACT

A method and apparatus are disclosed for writing to a large content addressable memory (CAM) array without causing substantial power supply current surges, for providing fully static CMOS memory cells, for providing a consistent precharge of bit and bit bar lines, for providing a column write capability, and for increasing a read current while reducing a read disturbance probability. Each memory cell in the CAM array has (a) a data write circuit for accepting data, (b) a latch circuit for latching the data in the memory cell, (c) a hold circuit to allow holding the data or writing new data, (d) a data compare circuit for comparing the new data to the stored data, and (e) a data read circuit for reading the stored data. A memory cell further has control lines including (a) a read row enable (rren) line for enabling and disabling the data read circuit, (b) a match line for indicating a match between the stored data and the new data, (c) a write row enable (wren) line for enabling and disabling a row for a write operation, (d) a write column enable (wcen) line for enabling and disabling a column for a write operation, (e) a bit line, (f) a write column enable bar (wrenb) line for enabling and disabling the column for a write operation, and (g) a bit bar line. The present application also discloses methods for writing to CAM cells with a minimum power surge, for writing to a column of CAM cells, and for finding a match in the CAM array.

24 Claims, 8 Drawing Sheets

FULLY STATIC CAM CELLS WITH LOW WRITE POWER AND METHODS OF MATCHING AND WRITING TO THE SAME

BACKGROUND OF THE INVENTION

1. Field of the Invention:

The present invention relates to the field of content addressable memories, associative storage, parallel-search storage, and memory cells.

2. Description of Related Art.:

Content addressable memories (CAMs) are used in computer data processing to identify the location of the data stored in the memory by specifying part or all of its contents. When a match is found in a CAM array chip, the chip sends an output to its match line indicating that a match is found in that CAM array chip.

FIG. 1A presents a prior art CAM cell 100. CAM cell 100 includes two data latch units I1 and I2, each of which is an inverter which may be implemented by the circuit shown in FIG. 1B. CAM cell 100 includes a data word match line (match) 101, a read/write row select line (rsel) 102, a read/write column select line (csel) 104, a data bit line (bit) 103 used for a read, write or match operation, and a data bit bar line (bitb) 105 used for a read, write or match operation. Bitb 105 may or may not be complementary to bit 103.

Rsel 102 and csel 104 must both be a logic 1 to read or write to CAM cell 100. A WRITE operation is accomplished using the series transistors N5 and N6 connected to bit 103, and transistors N7 and N8 connected to bitb 105. Writing data to CAM cell 100 requires overcoming the crowbar current in I1 and I2. It is crucial to have proper width-to-length ratios of transistors in I1 and I2 and transistors N5, N6, N7 and N8, to ensure adequate drive in WRITE transistors (N5, N6, N7 and N8) and to prevent a read disturbance problem caused by too much drive.

During a MATCH operation, bit 103 and bitb 105 are precharged to a logic 0 (e.g. $V_{ss}$), and match 101 is precharged to a logic 1 (e.g. $V_{cc}$). After a data pattern is presented on bit 103 and bitb 105, match 101 for a row is pulled low if the data in any of the cells on the row does not match the pattern on bit 103 and bitb 105. It will be appreciated that in alternative CAM cells (not shown), the logic conventions may be different such that logic 0 corresponds to $V_{cc}$ and logic 1 corresponds to $V_{ss}$ or that the bit line may be precharged to logic 1 during a MATCH operation.

The disadvantages of CAM cell 100 include the following: First, a large crowbar current can occur during a WRITE operation when a large number of cells are written simultaneously. This results in large surges in the power supply current for the IC chip which contains the CAM. Second, csel 104 must be activated for both read and write operations. Third, internal nodes 106 and 107 share charges with bit 103 and bitb 105, respectively. This charge-sharing can create a large read access time pushout. Fourth, the precharge states on bit 103 and bitb 105 are not consistent for all operations. Finally, sizing of width-to-length length ratios of transistors in I1 and I2 and transistors N5, N6, N7 and N8 is sensitive to having a proper write operation and eliminating a read disturbance problem.

FIG. 2 presents another prior art CAM cell 119 described in Anthony J. McAuley and Charles J. Cotton, "A Self-Testing Reconfigurable CAM," *IEEE Journal of Solid-State Circuits* 26(3) pp. 257-261 (March 1991).

In CAM cell 119, transistors P12 and P14 are used to turn off the current path from Vcc to ground in I21 and I22 during a WRITE operation to limit the crowbar current. CAM cell 119 includes a write parallel line (wp) 120, a read/write word select line (ws) 121, a data word match line (match) 122, a data bit line (bit) 123 used for a read, write or match operation, and a data bit bar line (bitb) 124 used for a read, write or match operation. Bitb 124 may or may not be complementary to bit 123.

One disadvantage of CAM cell 119 is that it does not have the read/write column select capability. In addition, the precharge states on bit 123 and bitb 124 are not consistent for all operations.

Another prior art CAM cell (not shown) incorporates dynamic CMOS instead of fully static CMOS devices. However, dynamic CAM cells are disadvantageous because they have the same disadvantages as other dynamic memory cells compared to static CMOS memory cells, including but not limited to refresh requirements, read disturb and noise susceptibility.

To overcome the drawbacks of the prior art, the present invention provides fully static CAM cells operating at low power during a WRITE operation. In the present invention, data can be simultaneously written to a very large number of CAM cells without causing a power surge. The present invention also has features that help to manage the power consumed during other CAM operations by having consistent precharge states for bit and bitb lines for all CAM cell operations. In addition, the present invention includes selective column write capability for writing data to a selected column.

SUMMARY OF THE INVENTION

The present invention provides methods and apparatus for writing to a large content addressable memory (CAM) array without causing power supply current surges, for providing fully static CMOS memory cells, for providing a consistent precharge of bit and bit bar lines, for providing a column write capability, and for increasing a read current while reducing a read disturbance probability.

Each memory cell in the CAM array has (a) a data write circuit for accepting data, (b) a latch circuit for latching the data in the memory cell, (c) a hold circuit which controls holding the data stored in the memory cell or writing new data into the memory cell, (d) a data compare circuit for comparing the new data to the stored data, and (e) a data read circuit for reading the stored data.

A memory cell of the CAM array further has control lines. The control lines include (a) a read row enable (rren) line for enabling and disabling the data read circuit, (b) a match line for indicating a match between the stored data and the compare data, (c) a write row enable (wren) line for enabling and disabling write operations for a row, (d) a write column enable (wcen) line for enabling and disabling write operations to a column, (e) a bit line (bit) used for accepting the data or for reading the stored data, (f) a write column enable bar (wcenb) line for enabling and disabling write operations to a column, and (g) a bit bar line (bitb) used for accepting the data or for reading the stored data wherein the wcenb line is complementary to wcen line.

The present application discloses a method for writing to a CAM cell with a minimum power surge. The method includes the steps of (a) disabling the rren, wren, wcen and wcenb lines, (b) precharging the bit and bit bar lines, (c) enabling the wcen and wcenb lines, (d) enabling the wren line, (e) transmitting data to the bit and bit bar lines, (f) disabling the wren line, and (g) disabling the wcen and wcenb lines and typically, in most cases (e.g. when starting a write cycle), precharging the bit line.

In addition, the present application discloses a method for writing to a column of CAM cells. The method includes the steps of (a) disabling the rren, wren, wcen and wcenb lines, (b) precharging the bit and bit bar lines, (c) enabling the wcen, wcenb, selected wren lines, and transmitting data corresponding to a first type (1 or 0) of logic to the bit and bit bar lines if a bit in a select vector corresponding to the row in the CAM array contains the first type of logic, (d) disabling the wren lines, (e) enabling other wren lines for writing a second type of logic to the selected cells and transmitting data corresponding to a second type (0 or 1) of logic to the bit and bit bar lines if the bit in a select vector corresponding to the row contains the second type of logic, (f) disabling the wren line, (g) disabling the wcen and wcenb lines, and typically in most circumstances (e.g. when starting a write cycle) precharging the bit line.

The present application also discloses a method for finding a match in the CAM array. A match operation includes the steps of (a) precharging all of the bit lines and the bit bar lines of the CAM array, (b) precharging all of the match lines, (c) transmitting a data pattern to all of the bit lines and the bit bar lines, (d) changing the values of the match lines if the data pattern does not match the data stored in the CAM array.

DETAILED DESCRIPTION OF THE INVENTION

1. Components of the Preferred Embodiment

Figure 1A:
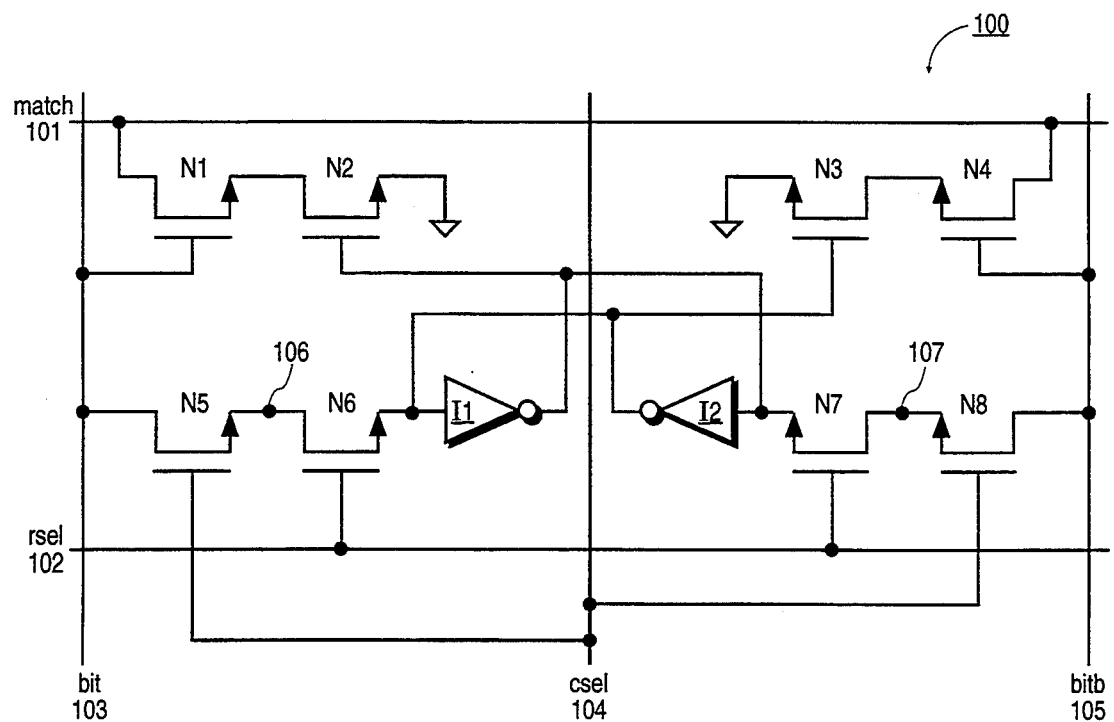
FIG. 1A presents a prior art CAM cell.
Figure 1B:
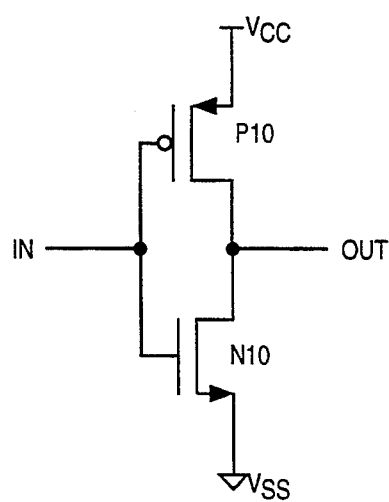
FIG. 1B presents an inverter unit that may be incorporated in I1 or I2 in FIG. 1A.
Figure 2:
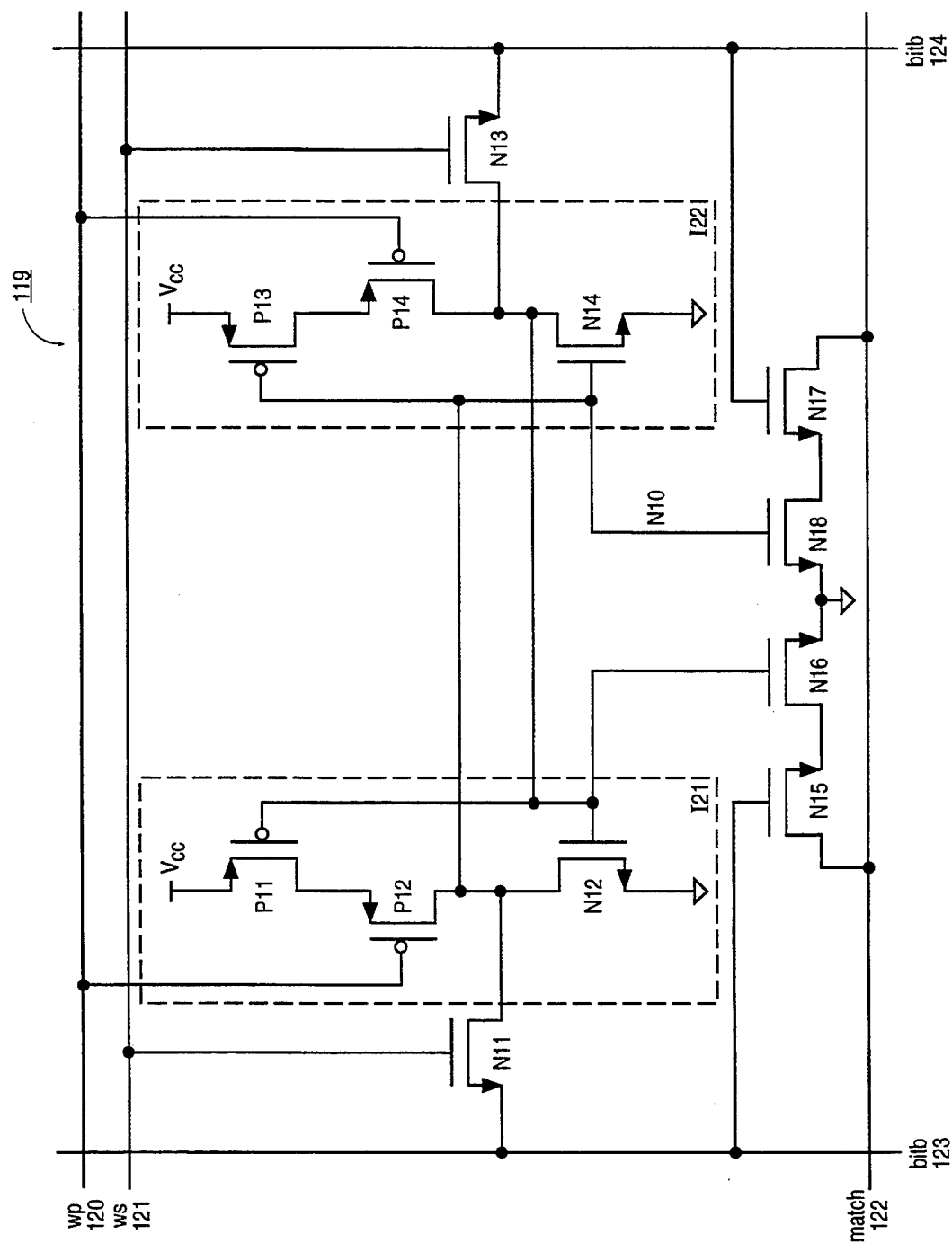
FIG. 2 presents another prior art CAM cell.
Figure 3:
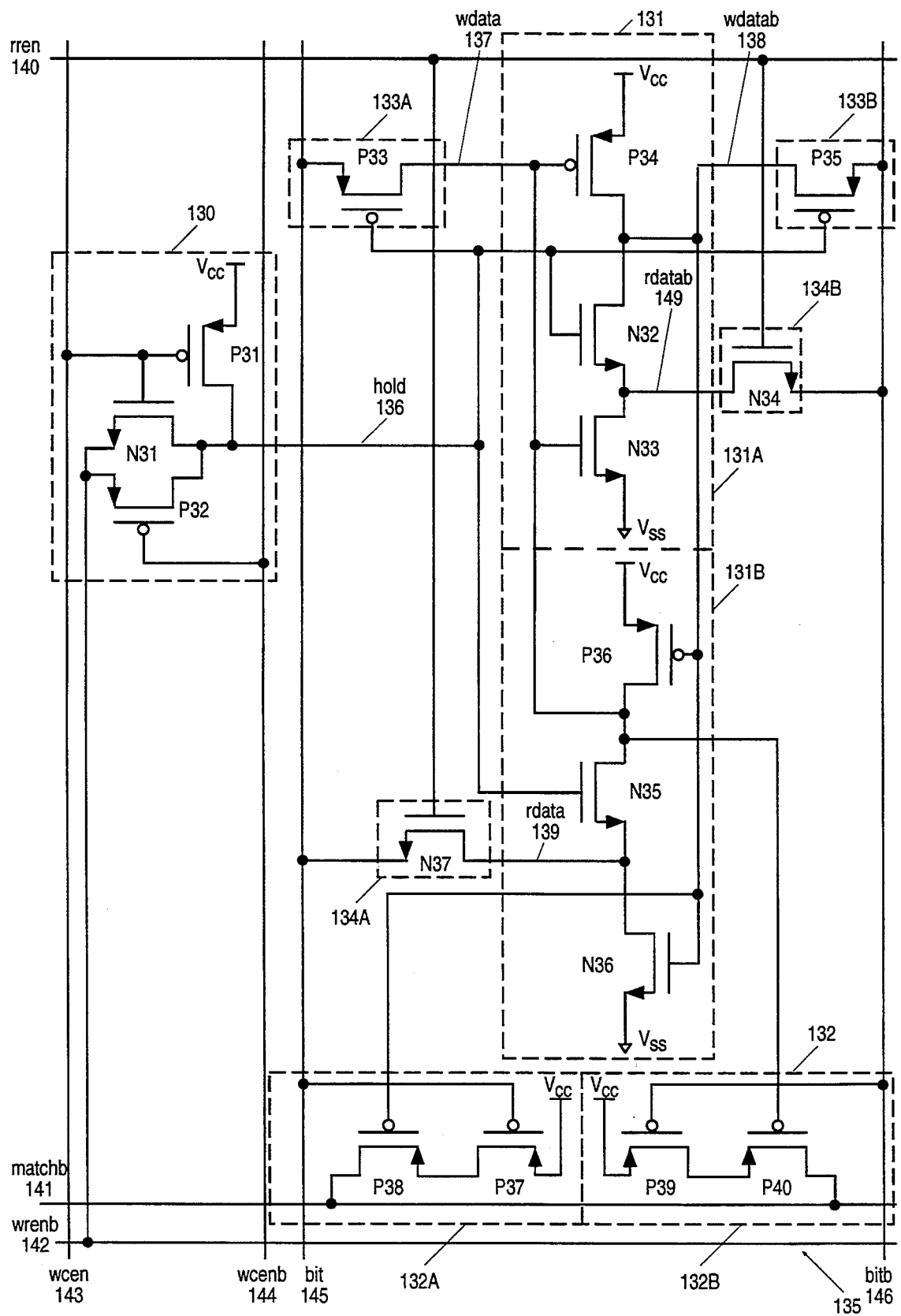
FIG. 3 presents a fully static CAM cell operating at low power during a WRITE operation according to the preferred embodiment of the present invention.
Figure 4:
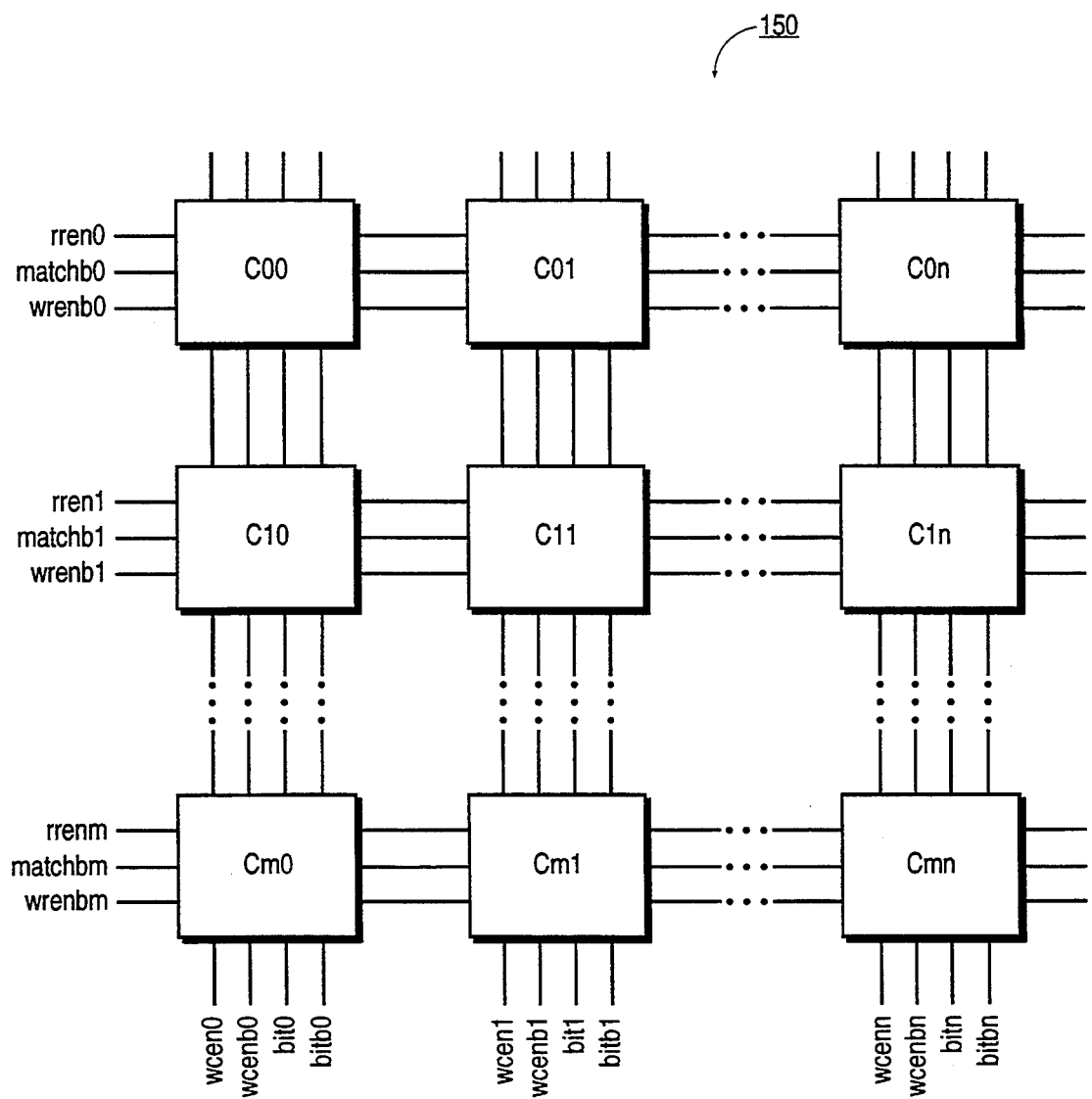
FIG. 4 presents an m x n array of CAM cells in FIG. 3.

FIG. 3 presents a fully static CMOS CAM cell 135 operating at low power during a WRITE operation according to the preferred embodiment of the present invention. CAM cell 135 is a part of a CAM array 150 organized in columns and rows as shown in FIG. 4.

In FIG. 3, CAM cell 135 has a hold circuit 130, a latch circuit 131, a data compare circuit 132, a data write circuit 133A/133B, and a data read circuit 134A/134B. CAM cell 135 also has control lines including a read row enable line (rren) 140, a data word match bar line (matchb) 141, a write row enable bar line (wrenb) 142, a write column enable (wcen) 143, a write column enable bar (wcenb) 144, a data bit line (bit) 145 used for a read, write or match operation, and a data bit bar line (bitb) 146 used for a read, write or match operation.

CAM cell 135 further includes internal signals such as a hold signal 136, a write data signal (wdata) 137, a write data bar signal (wdatab) 138, a read data signal (rdata) 139 and a read data bar signal (rdatab) 149. Hold signal 136 is used to select to hold the data stored in CAM cell 135 or to write new data to CAM cell 135. Wdata 137 and wdatab 138 present the data written to CAM cell 135. Rdata 139 and rdatab 149 contain the data to be read.

It should be noted that a signal xxxb is usually an inverted signal of a signal xxx, and that a circuit designer may denote a signal to be xxx or xxxb by choice. For example, wcenb 144 is complement of wcen 143. However, a signal xxxb may not always be an inverted signal of the signal xxx. For example, bitb 146 is not always complementary to bit 145, and wdatab 138 and rdatab 149 are not always complementary to wdata 137 and rdata 139, respectively.

It should be also noted that a transistor named Pxx is a P-channel MOSFET, and a transistor named Nxx is an N-channel MOSFET in the figures.

Latch circuit 131 includes a first data latch circuit 131A and a second data latch circuit 131B. First data latch circuit 131A includes transistors P34, N32 and N33. P34 and N33 form an inverter when N32 is conducting, and N32 is used to turn off the crowbar conduction path between P34 and N33 when data is written to CAM cell 135. Second data latch circuit 131B includes P36, N35 and N36. P36 and N36 form an inverter when N35 is conducting, and N35 is used to turn off the crowbar conduction path between P36 and N36 when data is written to CAM cell 135.

Data write circuit 133A/133B includes transistors P33 and P35. P33 and P35 are used to write data from bit 145 and bitb 146 into nodes wdata 137 and wdatab 138, respectively. Data read circuit 134A/134B includes transistors N37 and N34. N37 and N34 are used to read data stored in CAM cell 135 from rdata 139 and rdatab 149 to bit 145 and bitb 146, respectively. In the preferred embodiment, data write circuit 133A/133B includes transistors of only a first conductivity type (e.g. P channel MOSFETs as shown in FIG. 3), and data read circuit 134A/134B includes transistors of only a second conductivity type (e.g. N channel MOSFETs as shown in FIG. 3) where the transistors of the first and second types are complementary.

Data compare circuit 132 includes transistors P37, P38, P39 and P40 for comparing data in CAM cell 135 with data on bit 145 and bitb 146 during a CAM array MATCH operation which searches for all locations in the array that match the data pattern presented on bit and bitb lines. In the preferred embodiment, when a match is not found, a matchb line is pulled high. In another embodiment, when a match is found, a match line may be either pulled high or low, depending on the configuration.

Hold circuit 130 includes transistors P31, N31 and P32. P31, N31 and P32 combined with wcen 143, wcenb 144 and wrenb 142 generate hold signal 136 which controls whether to hold the data stored in CAM cell 135 or to write a new data to CAM cell 135. In the preferred embodiment, hold signal 136 is 0 only when wcen 143 is 1, and wrenb 142 is 0.

2. Operation of the Preferred Embodiment

Figure 5:
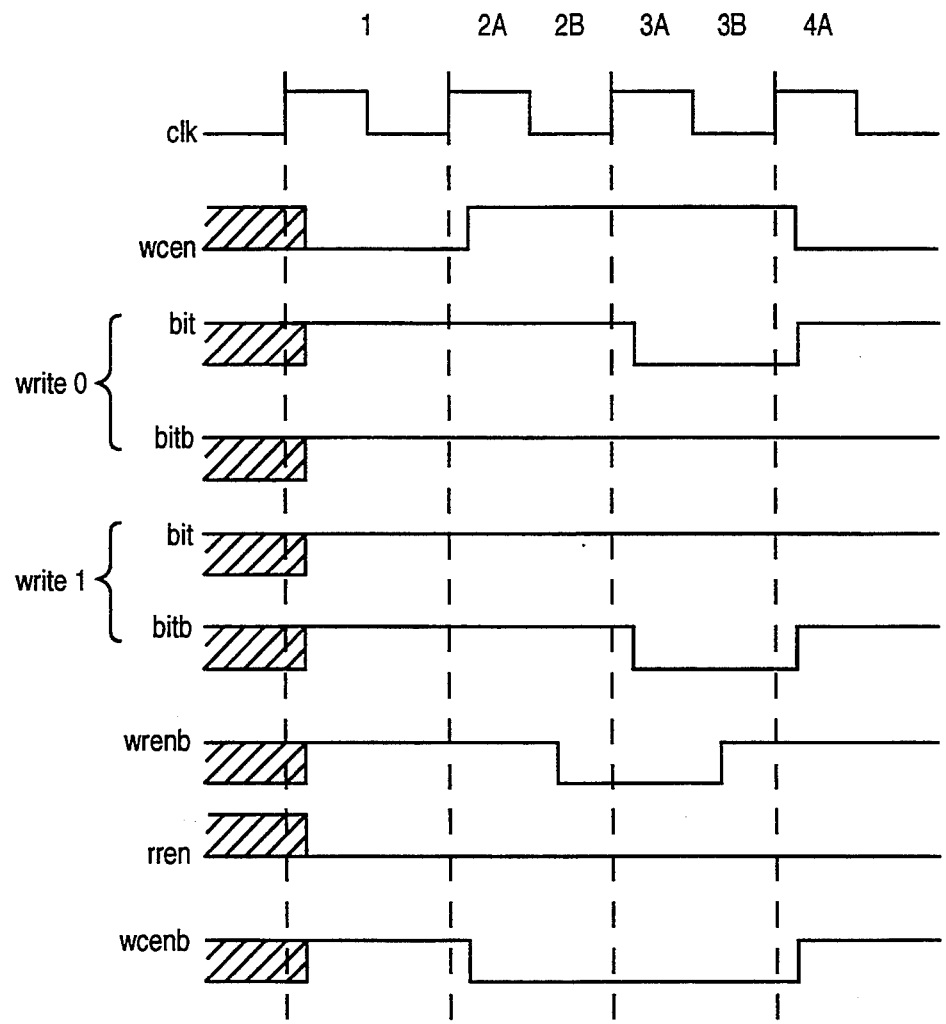
FIG. 5 presents a timing diagram for the CAM cell in FIG. 3 for a WRITE operation.
Figure 8:
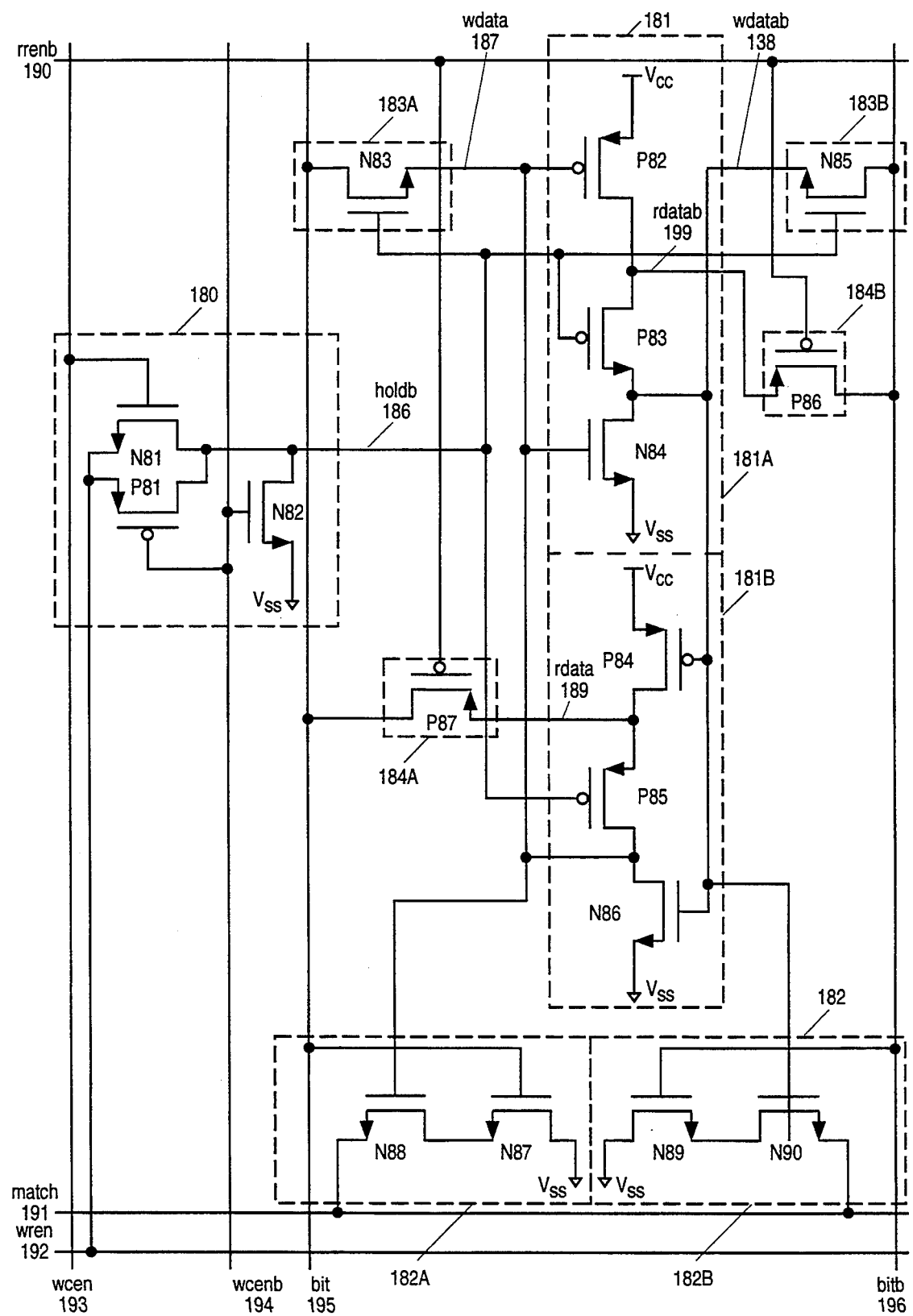
FIG. 8 presents a fully static CAM cell according to a third embodiment of the present invention.

FIG. 5 shows a timing diagram of CAM cell 135 for a WRITE operation in which a power surge is eliminated. In the preferred embodiment, memory cells in multiple rows and columns in FIG. 4 can be selected for a WRITE operation, although it is possible to select only one memory cell in a row and a column in CAM array 150 to be written. The sequence of the operation is as follows: During a period of 1, rren 140 is 0, wrenb 142 is 1, wcen 143 is 0, and wcenb 144 is 1. Hold signal 136 is 1, turning off P33 and P35. In one scenario of a use of the CAM array, all rren lines of CAM array 150 are 0's, all wrenb lines are 1's, all wcen lines are 0's, and all wcenb lines are 1's during period 1. In another scenario of a use of the CAM array, only the selected rren, wrenb, wcen and wcenb lines have the logic values stated above. During this period, bit 145 and bitb 146 are precharged to 1. This precharge may occur to all bit and bitb lines in one embodiment, and to only the selected bit and bitb lines in another embodiment. It will be appreciated that the particular logic values (e.g. 1 or 0) of the lines (e.g. rren, wcen, bit, wrenb, etc.) during the various periods depend on the particular logic devices which receive the signals from these lines; for example, other states are possible if different devices are used in the CAM cell circuit, and this is shown in the case of FIG. 8 where device N82 is used instead of device P31 of FIG. 3, and N channel devices (e.g. N88) are used in the match circuit 182 instead of P channel devices in match circuit 132 of FIG. 3. Note that, in the circuit of FIG. 8, the bit and bitb lines are precharged low (0).

During a period of 2A, wcen 143 becomes 1, and wcenb 144 becomes 0 to enable a column for the WRITE operation. Wrenb 142 drives hold signal 136, and since wrenb 142 is 1, hold signal 136 is still 1. During a period of 2B, wrenb 142 becomes 0, pulling hold signal 136 to 0, turning on both P33 and P35 and turning off both N32 and N35. Thus, the data on bit 145 and on bitb 146 are transferred to nodes wdata 137 and wdatab 138, respectively. Since both bit 145 and bitb 146 are 1's, wdata 137 and wdatab 138 become 1's. Since bit 145, bitb 146, wdata 137 and wdatab 138 are 1's, P34, P36, P37, P38, P39 and P40 are off.

During a period of 3A, either bit 145 or bitb 146 becomes 0. In the preferred embodiment, to write a 1 to CAM cell 135, bit 145 stays high, and bitb 146 becomes low. On the other hand, to write a 0 to CAM cell 135, bit 145 goes low, and bitb 146 stays high. In another embodiment, writing a 1 to CAM cell 135 may mean setting bit 145 to 0 and bitb 146 to 1. Since both P33 and P35 are still on, the data on bit 145 and on bitb 146 are transferred to wdata 137 and wdatab 138, respectively. If bit 145 is 0, wdata 137 becomes 0. For first data latch circuit 131A, although P34 turns on, N32 is off because hold 136 is 0. Thus, as wdata 137 changes from 1 to 0, no current surge occurs because N32 is off. For second data latch circuit 131B, N35 stops the crowbar current flowing from P36 to N36. In data compare circuit 132, one of P38 and P37 is off, and one of P39 and P40 is off due to the cross-coupled nature of the transistors. Thus, both 132A and 132B are off.

During a period of 3B, wrenb 142 becomes 1. Hold signal 136 becomes 1, and the WRITE operation is completed, and the data are latched in latch circuit 131. During a period of 4A, wcen 143 becomes 0, and wcenb 144 becomes 1. While hold signal 136 stays high, column write signals wcen 143 and wcenb 144 are disabled.

During period 4A, in the preferred embodiment, all wcen and wcenb lines are disabled, and in another embodiment, only selected wcen and wcenb lines are disabled.

Since the cell crowbar current for the above sequence is virtually 0, an entire array of CAM cells can be written simultaneously without causing large power supply current surges. Depending on the size of the total CAM array and the number of arrays on a chip, a WRITE operation may be segmented on array or partial array boundaries with each segment having the WRITE sequence described above. The WRITE sequences for each segment would be non-overlapped in time to further limit the peak current.

Figure 6:
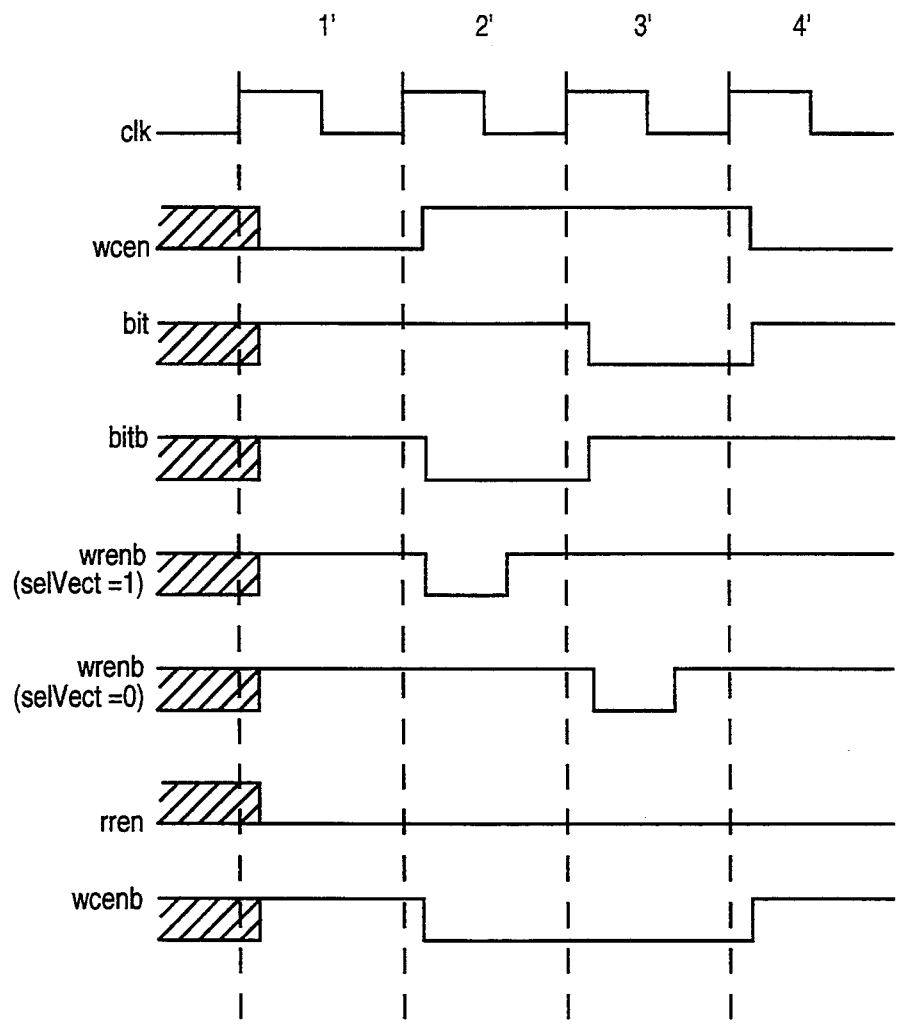
FIG. 6 presents a timing diagram for the CAM cell in FIG. 3 for a COLUMN WRITE operation.

FIG. 6 shows a timing diagram that is used for writing data to a selected column of CAM array 150. This operation is called a WRITE COLUMN operation in which a register called a "select vector" contains data to be written to a column in CAM array 150. Each row of CAM array 150 has a corresponding bit in the select vector so that if a bit in the select vector is 1, then a 1 will be written to the corresponding row/column intersections of CAM array 150. If, on the other hand, a bit in the select vector is 0, then a 0 will be written to the corresponding row/column intersections of CAM array 150. In the preferred embodiment of a COLUMN WRITE operation, one column and multiple rows in CAM array 150 are selected. In another embodiment, multiple columns and rows may be selected. One disadvantage of the scheme shown in FIG. 6 is that it does not ensure low crowbar current. But it can be used in situations where a limited number of cells will be written and a lower overall write cycle time is desired.

The sequence in FIG. 6 is as follows: During a period of 1', rren 140 is 0, wrenb 142 is 1, wcen 143 is 0, and wcenb 144 is 1. Any number of rows and columns may be selected. In one use of the CAM array where all rows and columns are selected, all rren lines are 0's, all wrenb lines are 1's, all wcen lines are 0's, and all wcenb lines are 1's during period 1'. In another use of the CAM array, less than all are selected by enabling selected rren, wrenb, wcen and wcenb lines to have the logic values stated above. Hold signal 136 is 1, turning off P33 and P35. During this period, bit 145 and bitb 146 are precharged to 1. This precharge occurs to all bit and bitb lines in the use where all rows and columns are selected, and to only the selected bit and bitb lines in the use where less than all are selected.

During a period of 2', logic 1's are written to cells in a selected column and selected rows in the preferred embodiment. Logic 1's are written to the rows having 1's in the corresponding bits in the select vector, and it is also possible to write the complementary of the select vector into these rows. During the first part of period 2', wcen 143 becomes 1, and wcenb 144 becomes 0 to enable a column; wrenb 142 becomes 0 to select a row; and bitb 146 becomes 0 to write 1's to the selected cells. It should be noted that not only wrenb 142 of one row, but other wrenb lines (for other rows in the array) can become 0, depending on the logic values in the select vector. During the latter part of period 2', wrenb 142 becomes 1 to complete writing 1's to the selected cells.

During a period of 3', logic 0's are written to cells in a selected column and selected rows in the preferred embodiment. Logic 0's are written to these cells on the rows having 0's in the corresponding bits in the select vector. During a first part of a period 3', bit 145 becomes 0, bitb 146 becomes 1, and wrenb 142 becomes 0 to write 0's to cells on rows with 0's in the select vector, and it is also possible to write the complementary of the select vector to these cells. During a latter part of period 3', wrenb 142 becomes 1 to complete writing 0's to the rows with 0's in the select vector.

During a period 4', wcen 143 becomes 0, wcenb 144 becomes 1, and bit 145 becomes 1 to complete the COLUMN WRITE operation. During period 4', in the preferred embodiment, all wcen and wcenb lines are disabled. In another embodiment, only selected wcen and wcenb lines are disabled, and only the selected bit line(s) is precharged. Although the sequence described above writes 1's first and then 0's to CAM array 150, the order may be reversed.

When the sequence in FIG. 6 is used, some crowbar current can occur in the CAM cells during the first part of periods 2' and 3'.

During a READ operation, rren 140 becomes 1, turning on N34 and N37. Data in rdata 139 is transferred to bit 145, and data in rdatab 149 is transferred to bitb 146.

A MATCH operation identifies all rows (or words) in CAM array 150 that match the data pattern presented on the bit and bitb lines of CAM array 150. The MATCH operation sequence, if the embodiment of FIG. 3 is used, is as follows: (1) All the bit and bitb lines of CAM array 150 are precharged to 1. (2) All the matchb lines of CAM array 150 are precharged to 0. (3) Selected bit and bitb lines are pulled down to 0 to present the desired data pattern to CAM array 150. "Masked" columns have both bit and bitb lines at 1. (4) If any cell on a row stores data that does not match the data presented on the bit and bitb lines (e.g., if bit 145 is 0 and wdatab 138 is 0), the matchb line for the row is pulled to 1, indicating the data in the row (or word) does not match the data presented. As noted above the signal values (e.g. 0 or 1) of the various lines will depend on the particular circuit embodiment used.

3. Advantages of the Preferred Embodiment

The present invention has the following advantages: First, the present invention provides low WRITE power, enabling writing to a large number of cells without having large power supply current surges. Second, the present invention provides low WRITE power for fully static CMOS cells instead of dynamic cells. Third, it provides a consistent precharge of bit and bitb lines, for the write, match and read cycles, resulting in low power consumption. The present invention establishes the consistent precharge (a) by having similar transistor types in data write circuit 133A/133B and data compare circuit 132 and (b) by having an inverted polarity for matchb 141. Fourth, it provides a column write capability, as described with reference to FIG. 6. Finally, the present invention increases the READ current while reducing the READ disturbance probability because rdata 139 is connected to N35 and N36, and rdatab 149 is connected to N32 and N33.

4. Other Embodiments of the Present Invention

Figure 7:
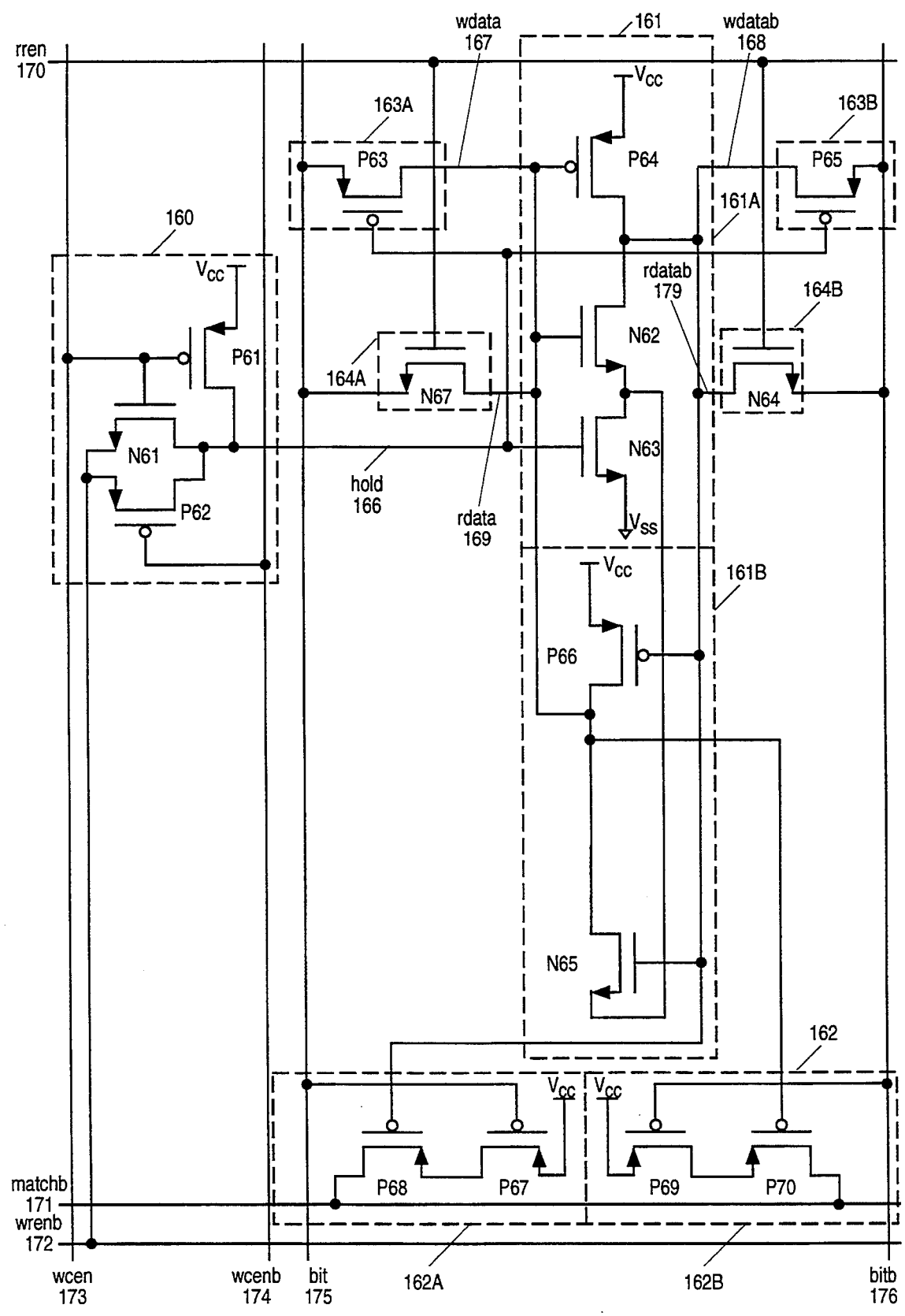
FIG. 7 presents a fully static CAM cell according to a second embodiment of the present invention.

A second embodiment of the present invention is shown in FIG. 7 in which the two data latch circuits (P64/N62 and P66/N65) of a latch circuit 161 share a switched N-channel pull-down transistor N63. In the second embodiment, the following connections are different from the preferred embodiment: a gate of N62 is coupled to wdata 167, a gate of N63 is coupled to hold signal 166, rdatab 179 is coupled to a drain of P64, rdata 169 is coupled to a drain of P66. The second embodiment does not have the advantage of increased READ current with lowered READ disturbance that is available in the preferred embodiment.

A third embodiment of the present invention, using the complementary logic in portions of the preferred embodiment, is shown in FIG. 8. In the third embodiment, the crowbar current in a latch circuit 181 is eliminated by switching off the positive current path to Vcc. The control signal polarities are changed as shown in Table 1.

TABLE 1

| Preferred Embodiment | Third Embodiment |
| --- | --- |
| wrenb | wren |
| matchb | match |
| hold | holdb |
| rren | rrenb |

In the third embodiment, the bit and bitb lines are precharged low (0) instead of high (1). Similarly, match lines are precharged high (1) instead of low (0).

While the present invention has been particularly described with reference to FIGS. 1 through 8, it should be understood that the figures are for illustration only and should not be taken as limiting the scope of the invention. Many changes and modifications may be made to the invention, by one having ordinary skill in the art, without departing from the spirit and scope of the invention as disclosed herein.

What is claimed is:

1. A memory cell comprising:
   a hold circuit for selecting one of holding and writing data in said memory cell;
   a latch circuit for latching said data in said memory cell, said latch circuit coupled to said hold circuit;
   a data compare circuit for comparing second data to said data, said data compare circuit coupled to said latch circuit;
   a data write circuit for writing said data, said data write circuit coupled to said latch circuit and to said hold circuit; and
   a data read circuit for reading said data, said data read circuit coupled to said latch circuit.

2. The memory cell of claim 1 wherein said memory cell is a content addressable memory and further comprising control lines, said control lines including:
   a read row enable (rren) line for enabling and disabling said data read circuit, said rren line coupled to said data read circuit;
   a match line for indicating a match between said data and said second data, said match line coupled to said data compare circuit;
   a write row enable (wren) line for enabling and disabling a row, said wren line coupled to said hold circuit;
   a write column enable (wcen) line for enabling and disabling a column, said wcen line coupled to said hold circuit; and
   a bit line for providing said data and said second data, said bit line coupled to said data write circuit, data read circuit and data compare circuit.

3. The memory cell of claim 2 wherein said control lines further includes:
   a second write column enable line for enabling and disabling said column, said second wcen line coupled to said hold circuit; and
   a second bit line for providing said data and said second data, said second bit line coupled to said data write circuit, data read circuit and data compare circuit wherein said second wcen line is complementary to said wcen line.

4. The memory cell of claim 3 wherein said data write circuit comprises:
a first write transistor having a first data write signal, said first write transistor for being controlled by said hold circuit and for transferring a first of said data from said bit line to said first data write signal, said first write transistor coupled to said bit line, said hold circuit and said latch circuit, said first data write signal coupled to said latch circuit; and
a second write transistor having a second data write signal, said second write transistor for being controlled by said hold circuit and for transferring a second of said data from said second bit line to said second data write signal, said second write transistor coupled to said second bit line, said hold circuit and said latch circuit, said second data write signal coupled to said latch circuit.

5. The memory cell of claim 4 wherein said data read circuit comprises:
a first read transistor having a first data read signal, said first read transistor for being controlled by said rren line and for transferring said first of said data to said bit line, said first read transistor coupled to said rren line, said bit line and said latch circuit; and
a second read transistor having a second data read signal said second read transistor for being controlled by said rren line and for transferring said second of said data to said second bit line, said second read transistor coupled to said rren line, said second bit line and said latch circuit.

6. The memory cell of claim 5 wherein said first and second write transistors are complementary to said first and second read transistors.

7. The memory cell of claim 6 wherein said data compare circuit comprises:
a first compare circuit having (a) a first and a second inputs, said first input of said first compare circuit coupled to said bit line, said second input of said first compare circuit coupled to said latch circuit and (b) an output coupled to said match line; and
a second compare circuit having (a) a first and a second inputs, said first input of said second compare circuit coupled to said second bit line, said second input of said second compare circuit coupled to said latch circuit and (b) an output coupled to said match line.

8. The memory cell of claim 7 wherein said latch circuit includes a first data latch circuit and a second data latch circuit;
said first data latch circuit has a first latch transistor for minimizing a crowbar conduction in said first data latch circuit.

9. The memory cell of claim 8 wherein said hold circuit comprises:
a first hold transistor for being controlled by said wcen line, said first hold transistor coupled to said wcen line;
a second hold transistor for being controlled by said wcen line, said second hold transistor coupled to said wren and wcen lines;
a third hold transistor for being controlled by said second wcen line, said third hold transistor coupled to said wren and second wcen lines; and
a hold signal as an output of said hold circuit, said hold signal coupled to said first, second and third hold transistors.

10. The memory cell of claim 9 wherein said first data latch circuit further comprises a second latch transistor and a third latch transistor, said second, first and third latch transistors are coupled in series, said second and third latch transistors are controlled by said first data write signal, said first latch transistor is controlled by said hold signal, said second data read signal is coupled to said first and third latch transistors to increase a read current and to decrease a read disturbance probability;
said second data latch circuit comprises a fourth latch transistor, a fifth latch transistor and a sixth latch transistor, said fourth, fifth and sixth latch transistors are coupled in series, said fourth and sixth latch transistors are controlled by said second data write signal, said fifth latch transistor is controlled by said hold signal, said first data read signal is coupled to said fifth and sixth latch transistors to increase a read current and to decrease a read disturbance probability, said fifth latch transistor is used to turn off a crowbar conduction path in said second data latch circuit;
said first and second write transistors are controlled by said hold signal;
said second input of said first compare circuit is coupled to said second data write signal;
said second input of said second compare circuit is coupled to said first data write signal; and
said match line is an inverted line.

11. The memory cell of claim 9 wherein said first data latch circuit further comprises a second latch transistor and a third latch transistor, said second, third and first latch transistors are coupled in series, said second and third latch transistors are controlled by said first data write signal, said first latch transistor is controlled by said hold signal, said second data read signal is coupled to said second data write signal;
said second data latch circuit comprises a fourth latch transistor and a fifth latch transistor, said fourth and fifth latch transistors are coupled in series, said fifth latch transistor is coupled to said first latch transistor, said fourth and fifth latch transistors are controlled by said second data write signal, said first data read signal is coupled to said first data write signal, said first latch transistor is used to minimize a crowbar conduction in said second data latch circuit;
said first and second write transistors are controlled by said hold signal;
said second input of said first compare circuit is coupled to said second data write signal;
said second input of said second compare circuit is coupled to said first data write signal; and
said match line is an inverted line.

12. The memory cell of claim 8 wherein said hold circuit comprises:
a first hold transistor for being controlled by said wcen line, said first hold transistor coupled to said wcen and wren lines;
a second hold transistor for being controlled by said second wcen line, said second hold transistor coupled to said wren and second wcen lines;
a third hold transistor for being controlled by said second wcen line, said third hold transistor coupled to said second wcen line; and a hold signal as an output of said hold circuit, said hold signal coupled to said first, second and third hold transistors.

13. The memory cell of claim 12 wherein said first data latch circuit further comprises a second latch transistor and a third latch transistor, said second, first and third latch transistors are coupled in series, said second and third latch transistors are controlled by said first data write signal, said first latch transistor is controlled by said hold signal, said second data read signal is coupled to said second and first latch transistors to increase a read current and to decrease a read disturbance probability;

said second data latch circuit comprises a fourth latch transistor, a fifth latch transistor and a sixth latch transistor, said fourth, fifth and sixth latch transistors are coupled in series, said fourth and sixth latch transistors are controlled by said second data write signal, said fifth latch transistor is controlled by said hold signal, said first data read signal is coupled to said fourth and fifth latch transistors to increase a read current and to decrease a read disturbance probability, said fifth latch transistor is used to minimize a crowbar conduction in said second data latch circuit;

said first and second write transistors are controlled by said hold signal;

said second input of said first compare circuit is coupled to said first data write signal;

said second input of said second compare circuit is coupled to said second data write signal; and said match line is a non-inverted line.

14. The memory cell of claim 8 wherein said data write circuit includes only transistors of one type, and said data compare circuit includes only transistors of said one type or another type.

15. The memory cell of claim 3 wherein the memory cell is one cell of a content addressable memory (CAM) array wherein cells in a same column share the same bit, second bit, wcen and second wcen lines; and cells in a same row share the same rren, match and wren lines.

16. A method for writing to a memory cell, said memory cell having control lines including (i) a read row enable (rren) line for enabling a row for a read operation, (ii) a match line for indicating a match, (iii) a write row enable (wren) line for enabling and disabling a row for a write operation, (iv) a write column enable (wcen) line for enabling and disabling a column for a write operation, and (v) a bit line for providing data, said method comprising the steps of:

(a) disabling said rren, wren, and wcen lines;
(b) precharging said bit line;
(c) enabling said wcen line;
(d) enabling said wren line;
(e) transmitting data to said bit line;
(f) disabling said wren line; and
(g) disabling said wcen line.

17. The method of claim 16 wherein said control lines include (vi) a second write column enable line for enabling and disabling said column for a write operation, and (vii) a second bit line for providing said data, wherein said second wcen line is complementary to said wcen line, and said memory cell comprises:

a hold circuit for selecting one of holding and writing said data in said memory cell;

a latch circuit for latching said data in said memory cell, said latch circuit coupled to said hold circuit;

data compare circuit for comparing said second data to said data, said data compare circuit coupled to said latch circuit;

a data write circuit for writing said data, said data write circuit coupled to said latch circuit and to said hold circuit; and a data read circuit for reading said data, said data read circuit coupled to said latch circuit wherein said rren line is coupled to said data read circuit; said match line is coupled to said data compare circuit; said wren line is coupled to said hold circuit; said wcen line is coupled to said hold circuit; said bit line is coupled to said data write circuit, data read circuit and data compare circuit; said second wcen line is coupled to said hold circuit; and said second bit line is coupled to said data write circuit, data read circuit and data compare circuit;

wherein a crowbar current in said latch circuit is minimized.

18. The method of claim 17 wherein during the step (c), said column is enabled, and said wren line drives a hold signal, said hold signal being an output of said hold circuit;

during the step (d), said hold signal is low, a first data write and a second data write signals are high, said first and second data signals being coupled to said data write circuit and to said latch circuit, said data compare circuit is off;

during the step (e), said data are written to said first and second data write signals; and during the step (f), said hold signal is high.

19. A method for writing to a memory cell, said memory cell having control lines including (i) a read row enable (rren) line for enabling a row for a read operation, (ii) a match line for indicating a match, (iii) a write row enable (wren) line for enabling and disabling a row for a write operation, (iv) a write column enable (wcen) line for enabling and disabling a column for a write operation, and (v) a bit line for providing data, said method comprising the steps of:

(a) disabling said rren, wren, and wcen lines;
(b) precharging said bit line;
(c) enabling said wcen, wren lines, and transmitting data to said bit line;
(d) disabling said wren line;
(e) transmitting data to said bit line, and enabling said wren line;
(f) disabling said wren line;
(g) disabling said wcen line.

20. The method of claim 19 wherein said control lines include (vi) a second write column enable line for enabling and disabling said column, and (vii) a second bit line for providing said data, wherein said second wcen line is complementary to said wcen line, and said memory cell comprises:

a hold circuit for selecting one of holding and writing said data in said memory cell;

a latch circuit for latching said data in said memory cell, said latch circuit coupled to said hold circuit;

a data compare circuit for comparing said second data to said data, said data compare circuit coupled to said latch circuit;

a data write circuit for writing said data, said data write circuit coupled to said latch circuit and to said hold circuit; and a data read circuit for reading said data, said data read circuit coupled to said latch circuit wherein said rren line is coupled to said data read circuit; said match line is coupled to said data compare circuit; said wren line is coupled to said hold circuit; said wcen line is coupled to said hold circuit; said bit line is coupled to said data write circuit, data read circuit and data compare circuit; said second wcen line is coupled to said hold circuit; and said second bit line is coupled to said data write circuit, data read circuit and data compare circuit.

21. The method of claim 20 wherein during the step (c), a first type of logic is written to the memory cell if a bit in a select vector corresponding to said row contains said first type of logic, said select vector is coupled to an array of content addressable memory (CAM) cells wherein said memory cell is one of the memory cells; and during the step (e), a second type of logic is written to the memory cell if said bit in a select vector corresponding to said row contains said second type of logic wherein cells of said array in a same column share the same bit, second bit, wcen and second wcen lines; and cells of said array in a same row share the same rren, match and wren lines.

22. A method for finding a match in a content addressable memory (CAM) array having a plurality of memory cells, each of said plurality of memory cells having control lines including a match line for indicating a match, a bit line, and a second bit line, said method comprising the steps of:

(a) precharging all of said bit lines and said second bit lines;

(b) precharging all of said match lines;

(c) transmitting a data pattern to all of said bit lines and said second bit lines;

(d) changing values of said match lines if said data pattern does not match data stored in said CAM array.

23. The method of claim 22 wherein each of said memory cells comprises:

a hold circuit for selecting one of holding and writing said data in said memory cell;

a latch circuit for latching said data in said memory cell, said latch circuit coupled to said hold circuit;

a data compare circuit for comparing second data to said data, said data compare circuit coupled to said latch circuit;

a data write circuit for writing said data, said data write circuit coupled to said latch circuit and to said hold circuit; and a data read circuit for reading said data, said data read circuit coupled to said latch circuit wherein said match line is coupled to said data compare circuit; said bit line is coupled to said data write circuit, data read circuit and data compare circuit; and said second bit line is coupled to said data write circuit, data read circuit and data compare circuit.

24. A method for writing to a memory cell, said memory cell having (a) a hold circuit; (b) a latch circuit coupled to said hold circuit, said latch circuit latching data in said memory cell and said hold circuit selecting one of holding and writing to said memory cell, said latch circuit consuming power at a first rate and a second rate; (c) a data compare circuit for comparing a second data to said data, said data compare circuit coupled to said latch circuit; (d) a data write circuit coupled to said latch and to said hold circuit; and (e) a data read circuit coupled to said latch circuit, said method comprising:

selecting said memory cell for writing by enabling said data write circuit;

sending a signal to said hold circuit to select writing and causing said latch circuit to consume power at said second rate;

writing data to said latch circuit while said latch circuit consumes power at said second rate.

* * * * *